United States Patent
Ruan

(10) Patent No.: US 8,773,291 B2
(45) Date of Patent: Jul. 8, 2014

(54) AUDIO RECEIVER AND SAMPLE RATE CONVERTER WITHOUT PLL OR CLOCK RECOVERY

(75) Inventor: Wei Ruan, Phoenix, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/997,073

(22) PCT Filed: Feb. 13, 2012

(86) PCT No.: PCT/US2012/024844
§ 371 (c)(1),
(2), (4) Date: Jun. 21, 2013

(87) PCT Pub. No.: WO2013/122562
PCT Pub. Date: Aug. 22, 2013

(65) Prior Publication Data
US 2013/0321702 A1    Dec. 5, 2013

(51) Int. Cl.
*H03M 7/00* (2006.01)
*H04N 5/04* (2006.01)

(52) U.S. Cl.
CPC .. *H03M 7/00* (2013.01); *H04N 5/04* (2013.01)
USPC ............................................. 341/61; 704/501

(58) Field of Classification Search
CPC .................................. H04N 5/04; H03M 7/00
USPC ......... 341/61, 51, 50; 348/515; 704/501, 228, 704/500; 700/94; 438/95
See application file for complete search history.

(56) References Cited

U.S. PATENT DOCUMENTS

| | | | |
|---|---|---|---|
| 7,474,724 B1 | 1/2009 | Gudmunson et al. | |
| 7,590,531 B2 * | 9/2009 | Khalil et al. | 704/228 |
| 7,831,434 B2 * | 11/2010 | Mehrotra et al. | 704/500 |
| 7,833,824 B2 * | 11/2010 | Lee | 438/95 |
| 2007/0030387 A1 | 2/2007 | Kim | |
| 2008/0168294 A1 | 7/2008 | Batson et al. | |
| 2010/0153122 A1 | 6/2010 | Wang et al. | |

FOREIGN PATENT DOCUMENTS

WO    2013/122562 A1    8/2013

OTHER PUBLICATIONS

International Search Report and Written Opinion received for PCT application No. PCT/US2012/024844, mailed on Oct. 29, 2012, 9 pages.

* cited by examiner

*Primary Examiner* — Jean B Jeanglaude
(74) *Attorney, Agent, or Firm* — Jordan IP Law, LLC

(57) ABSTRACT

Methods and systems of operating an audio receiver may include a reference module configured to determine an input number of clocks per number of frames for an audio signal based on a reference clock and a specified number of frames. The audio receiver can also include a conversion module configured to re-sample the audio signal based on the input number of clocks per number of frames, the specified number of frames, and a specified number of clocks per number of frames.

20 Claims, 3 Drawing Sheets

AUDIO RECEIVER AND SAMPLE RATE CONVERTER WITHOUT PLL OR CLOCK RECOVERY

BACKGROUND

1. Technical Field

Embodiments generally relate to audio receivers. More particularly, embodiments relate to the synchronization of received audio signals with reference clocks that are associated with other devices and/or systems.

2. Discussion

In a video system, the synchronization of digital audio signals with video signals may he conducted in order to prevent audio samples from being either dropped or repeated. Conventional synchronization approaches may involve the use of a separate audio clock, which can be locked to a video clock via a phase locked loop (PLL). Indeed, some solutions may involve the use of multiple PLLs, wherein one PLL can be used to recover the audio clock from the input audio signal, and another PLL can be used to lock the output audio clock to a video clock. Such an approach may increase the overall cost of the video system.

BRIEF DESCRIPTION OF THE DRAWINGS

The various advantages of the embodiments of the present invention will become apparent to one skilled in the art by reading the following specification and appended claims, and by referencing the following drawings, in which:

DETAILED DESCRIPTION

Embodiments may include an apparatus including a reference module to determine an input number of clocks per number of frames for an audio signal based on a reference clock and a specified number of frames. The apparatus can also include a conversion module to re-sample the audio signal based on the input number of clocks per number of frames, the specified number of frames and a specified number of clocks per number of frames.

Embodiments may also include a system having a video receiver to receive a video signal that includes a reference clock, and an audio receiver to receive an audio signal. The audio receiver can include a reference module to determine an input. number of clocks per number of frames for the audio signal based on the reference clock and a specified number of frames, and a conversion module to re-sample the audio signal based on the input number of clocks per number of frames, the specified number of frames and a specified number of clocks per number of frames.

In addition, embodiments can include a method in which a first audio signal is received, and a reference clock is received, wherein the reference clock is associated with a signal other than the first audio signal. The method may also provide for determining a specified number of frames, and determining a specified number of clocks per number of frames. An audio pulse can be generated for each specified number of frames in the audio signal, wherein clock pulses in the reference clock may be counted for each audio pulse. The method may also involve generating one or more count signals associated with the counted clock pulses, and averaging the one or more count signals. Additionally, a signal that identifies an input number of clocks per number of frames may be generated based on the average. The method can also provide for obtaining an audio sample signal from an audio sample buffer, wherein the audio sample signal is associated with the first audio signal. Moreover, a ratio signal may be generated based on the input number of clocks per number of frames and the specified number of clocks per number of frames, wherein the method can involve re-sampling the audio sample signal based on the ratio signal, the specified number of frames and the specified number of clocks per number of frames.

Figure 1:
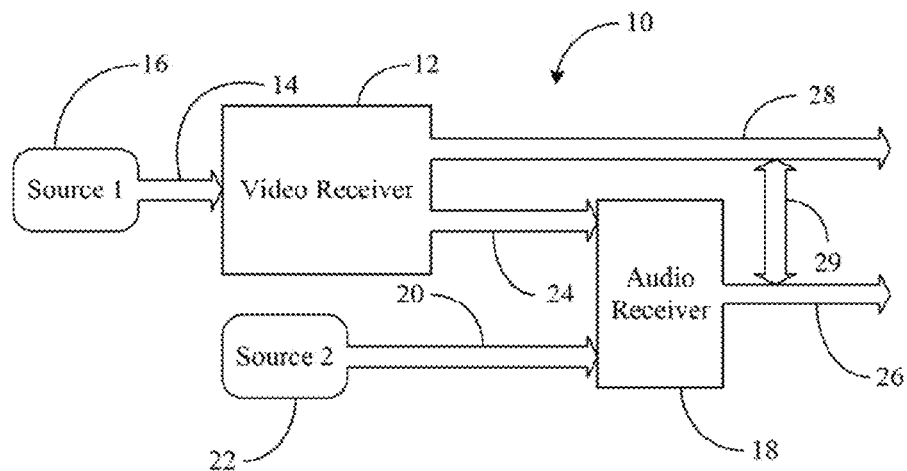
FIG. 1 is a block diagram of an example of a system according to an embodiment.

Turning now to FIG. 1, a rate conversion system 10 is shown. In the illustrated example, a video receiver 12 receives a video signal 14 from a first source ("Source 1") 16, and an audio receiver 18 receives a digital audio signal 20 from a second source ("Source 2") 22, wherein the audio signal 20 may lack. a separate clock. The audio receiver 18 may therefore use a reference clock 24 from the video receiver 12 to re-sample the audio signal 20 so that a re-sampled audio signal 26 is synchronized 29 with an output video signal 28 of the video receiver 12. Because the illustrated re-sampled audio signal 26 has a sample rate that matches the sample rate of the output video signal 28, the signals 26, 28 may be readily mixed without concern over dropping or repeating audio samples. Moreover, the illustrated synchronization is conducted without the use of a separate audio clock or a phase locked loop (PLL), which may otherwise add to the cost of the system 10.

While the reference clock 24 is shown as being obtained from the video receiver 12, other reference clock sources may be used. For example, the reference clock 24 might be associated with another audio signal (e.g., in an audio mixing application), a global positioning system (GPS) signal (e.g., in a GPS-enabled handset), and so forth. The ability to synchronize the audio signal 20 with other sources without the use of a separate audio clock or PLL may therefore provide substantial benefits in a wide variety of applications and platforms.

Figure 2:
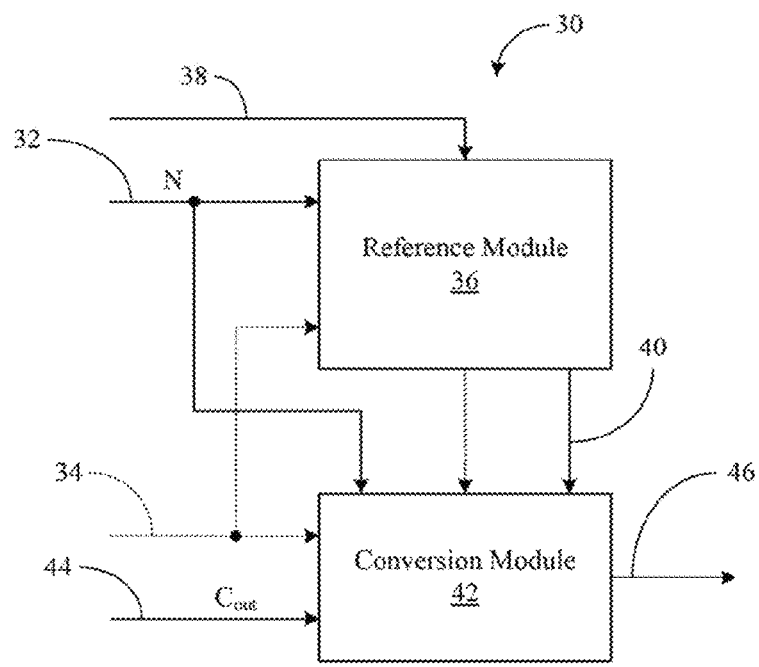
FIG. 2 is a block diagram of an example of an audio receiver according to an embodiment.

FIG. 2 shows an example of an audio receiver 30 that is used to re-sample an input audio signal 34. Thus, the audio receiver 30 may be readily substituted for the audio receiver 18 (FIG. 1), already discussed. In the illustrated example, the audio receiver 30 includes a reference module 36 that determines an input number of clocks per number of frames (e.g., "N") for the audio signal 34 based on a reference clock 38 and a specified number of frames (e.g., "N") 32, and generates a signal 40 that indicates the input number of clocks per number of frames for the audio signal 34. The relationship between the input audio sample rate and the input number of clocks per number of frames could be determined according to an expression such as, $$Rate_{in} = F_{ref} * N / C_{in}$$

where $Rate_{in}$ is the input sample rate, $F_{ref}$ is the frequency of the reference clock 38, N is the specified number of frames, and $C_{in}$ is the number of clocks per N frames in the input audio signal 34. As will be discussed in greater detail, $C_{in}$ may be obtained from a clock counter stage in the reference module 36. Additionally, either the input audio signal 34 may be routed through the reference module 36 if the reference module 36 detects preambles in the audio signal 34 in order to determine the input number of clocks per number of frames (e.g., Audio Engineering/AES compliant or Sony/Philips Digital interconnect Format/S/PDIF compliant audio signal), or the input audio signal 34 may be fed directly to a conversion module 42 of the audio receiver 30 if the reference module 36 uses a separate word select (WS) signal associated with the input audio signal 34 to determine the input number of clocks per number of frames (e.g., Integrated Interchip Sound/I2S compliant audio signal).

The illustrated conversion module 42 re-samples the audio signal 34 based on the signal 40 that indicates the input number of clocks per number of frames, the specified number of frames 32, and a specified number of clocks per number of frames (e.g., $C_{out}$) 44, and generates a re-sampled audio output signal 46. In this regard, the output sample rate can be controlled by adjusting two parameters—N and $C_{out}$—in the example shown. In particular, the adjustment may be conducted according to an expression such as, $$Rate_{out} = F_{ref} * N / C_{out}$$

where $Rate_{out}$ is the output sample rate, and $C_{out}$ is the number of clocks per N frames in the output audio signal 46. For example, if the reference clock 38 has a frequency of 27 MHz and the desired audio sample rate is 48 KHz, the fraction N/C would be 48,000/27,000, which can be simplified to 2/1125. In such a case, N may be set to two (2) and C may be set to (1125). The table below shows example parameter values that may be specified.

TABLE I

| Reference Clock | Desired Sample Rate | N | $C_{out}$ |
|---|---|---|---|
| 27 MHz | 48 KHz | 2 | 1125 |
| 27 MHz | 44.1 KHz | 49 | 30000 |
| 27 MHz | 32 KHz | 4 | 3375 |
| 24.576 MHz | 32 KHz | 1 | 768 |
| 10 MHz | 48 KHz | 2 | 625 |

The parameters N and $C_{out}$ may be specified in, for example, one or more registers, system memory, flash memory, etc., and may be programmable depending upon the application and/or platform. Moreover, the parameters N and $C_{out}$ could be user configurable as appropriate.

Figure 3A:
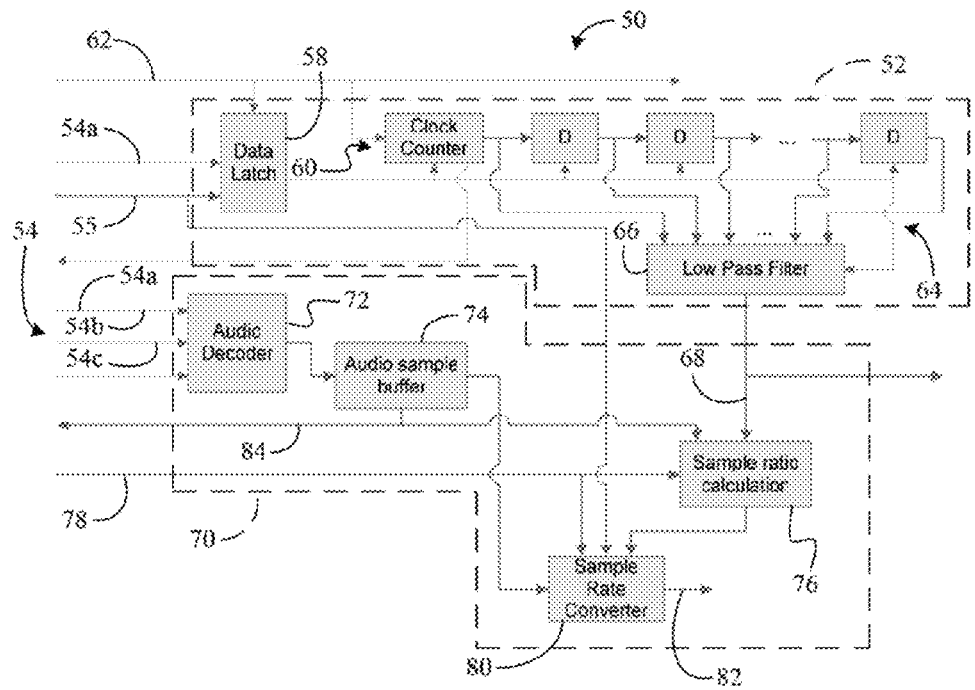
FIG. 3A is a block diagram of an example of an audio receiver configured to process audio signals having a word select component according to an embodiment.

FIG. 3A shows one approach to implementing an audio receiver 50 in which a reference module 52 uses a separate word select (e.g., I2S_WS) signal 54a associated with an input audio to signal 54 (54a-54c, e.g., I2S_WS, I2S_SCK, I2S_DAT) to determine the input number of clocks per number of frames (e.g., I2S compliant audio signal). In the illustrated example, the reference module 52 includes a latch configuration having a data latch 58 that receives the word select signal 54a and generates an audio pulse for each specified number of frames (e.g., N) 55 in the audio signal 54. In particular, the word select signal 54a may indicate the channel being submitted in the audio signal 54 and can enable the receiver 50 to store the previous word and clear the input for the next word. A clock counter stage 60 may count pulses in a reference clock 62 for each audio pulse generated by the data latch 58 and generate one or more count signals 64. In the illustrated example, a low pass filter 66 averages the count signals 64 and generates a signal 68 that identifies the input number of clocks per number of frames based on the average.

The audio receiver 50 may also include a conversion module 70 having an audio decoder 72 that stores audio samples to an audio sample buffer 74, and a sample ratio calculator 76. In the illustrated example, the sample ratio calculator 76 generates a ratio signal based on the input number of clocks per number of frames identified by the signal 68 and a specified number of clocks per number of frames 78 (e.g., $C_{out}$). In addition, the conversion module 70 may include a sample rate converter 80 that re-samples an audio sample signal 75 from the buffer 74 based on the ratio signal from the ratio calculator 76, the specified number of frames 55, and the specified number of clocks per number of frames 78.

The illustrated buffer 74 also outputs a buffer status signal 84, wherein the sample ratio calculator 76 may generate the ratio signal further based on the buffer status signal 84. In particular, to avoid dropping and/or repeating audio samples, the N and $C_{out}$ parameters may be tuned internally according to the status of the buffer 74, which may be a FIFO (first-in-first-out) buffer. For example, if the buffer occupancy is low (e.g., below a first threshold), the output rate may be adjusted downward by decreasing the ratio signal. Similarly, if the buffer occupancy is high (e.g., above a second, higher threshold), the output rate may be adjusted upward by increasing the ratio signal.

As a result, a re-sampled audio output signal 82 may be generated that is synchronized to the reference clock 62, without the use of a separate audio clock or additional PLL. As already noted, the reference clock 62 may originate from another device such as another audio receiver, a video receiver, a GPS receiver, and so forth.

Figure 3B:
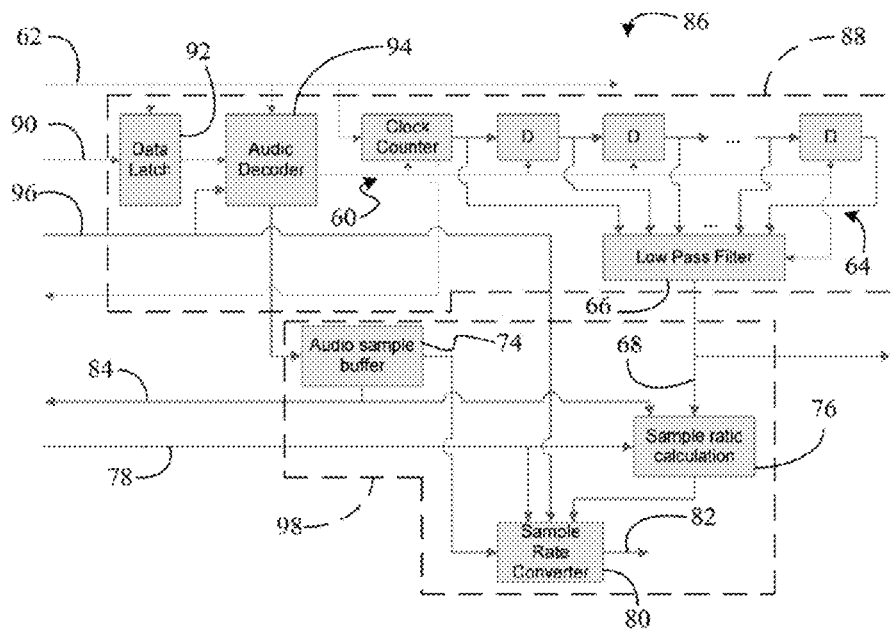
FIG. 3B is a block, diagram of an example of an audio receiver configured to process audio signals having a preamble according to an embodiment.

FIG. 3B shows another approach to implementing an audio receiver 86 in which a. reference module 88 detects a preamble in an audio signal 90 in order to determine the input number of clocks per number of frames (e.g., AES or S/PD1F compliant audio signal). In the illustrated example, the reference module 88 includes a latch configuration having a data latch 92 that receives the audio signal 90 and latches the audio signal 90 into an audio decoder 94, which generates an audio pulse for each specified number of frames (e.g., N) 96 in the audio signal 90. in particular, the audio decoder 94 may count the samples between rising or falling edges to determine the widths of the pulses (e.g., generating a width list). Based on the width list, the decoder 94 can search for preambles (e.g., X, Y or Z) and therefore decode the input audio signal 90 into audio samples and "CUVP" bits (e.g., P=Parity C=Channel Status U=User V=Validity). A clock counter stage 60 may count pulses in a reference clock 62 for each audio pulse generated by the latch configuration and generate one or more count signals 64, as already discussed. For example, a low pass filter 66 may average the count signals 64 and generate a signal 68 that identifies the input, number of clocks per number of frames based on the average.

The audio receiver 86 may also include a conversion module 98 having an audio sample buffer 74 that stores audio samples from the audio decoder 94, and a sample ratio calculator 76. The sample ratio calculator 76 may generate a ratio signal based on the input number of clocks per number of frames identified by the signal 68 and a specified number of clocks per number of frames 78, as already discussed. The remaining portion of the conversion module 98 can be configured to operate similarly as with respect to the aforementioned conversion module 70 (FIG. 3A).

Figure 4:
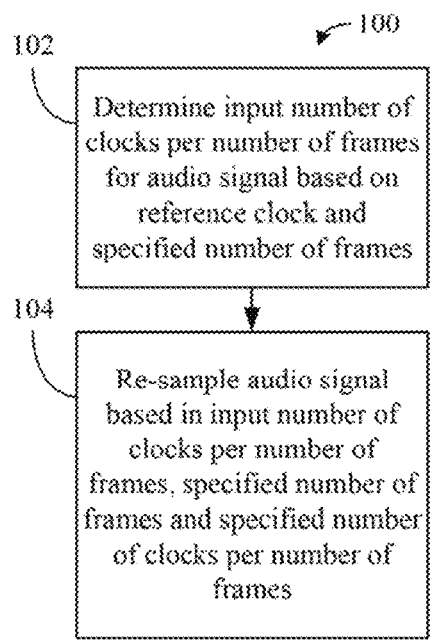
FIG. 4 is a flowchart of an example of a method of synchronizing an audio signal according to an embodiment.

Turning now to FIG. 4, a method 100 of synchronizing an audio signal is shown. The method 100 may be implemented in executable software as a set of logic instructions stored in a machine- or computer-readable medium of a memoty such as random access memoty (RAM), read only memory (ROM), programmable ROM (PROM), firmware, flash memory, etc., in configurable logic such as, for example, programmable logic arrays (PLAs), field programmable gate arrays (FPGAs), complex programmable logic devices (CPLDs), in fixed-functionality logic hardware using circuit technology such as, for example, application specific integrated circuit. (ASIC), complementary metal oxide semiconductor (CMOS) or transistor-transistor logic (TTL) technology, or any combination thereof. In one example, the method 100 is implemented in an audio receiver such as, for example, the audio receiver 50 (FIG. 3A) or the audio receiver 86 (FIG. 3B).

Processing block 102 provides for determining an input number of clocks per number of frames for an audio signal based on a reference clock and a specified number of frames. Additionally, block 104 may re-sample the audio signal based on the input number of clocks per number of frames, the specified number of frames, and a specified number of clocks per number of frames. Thus, the illustrated method 100 is conducted without recovering a separate audio clock or using a PLL to lock a separate audio clock to the reference clock. As a result, the method 100 may enable the use of a less costly audio receiver.

Embodiments of the present invention are applicable for use with all types of semiconductor integrated circuit ("IC") chips. Examples of these IC chips include but are not limited to processors, controllers, chipset components, programmable logic arrays (PLAs), memory chips, network chips, systems on chip (SoCs), SSD/NAND controller ASICs, and the like. In addition, in some of the drawings, signal conductor lines are represented with lines. Some may be different, to indicate more constituent signal paths, have a number label, to indicate a number of constituent signal paths, and/or have arrows at one or more ends, to indicate primary information flow direction. This, however, should not be construed in a limiting manner. Rather, such added detail may be used in connection with one or more exemplary embodiments to facilitate easier understanding of a circuit. Any represented signal lines, whether or not having additional information, may actually comprise one or more signals that may travel in multiple directions and may be implemented with any suitable type of signal scheme, e.g., digital or analog lines implemented with differential pairs, optical fiber lines, and/or single-ended lines.

Example sizes/models/values/ranges may have been given, although embodiments of the present invention are not limited to the same. As manufacturing techniques (e.g., photolithography) mature over time, it is expected that devices of smaller size could be manufactured. In addition, well known power/ground connections to IC chips and other components may or may not be shown within the figures, for simplicity of illustration and discussion, and so as not to obscure certain aspects of the embodiments of the invention. Further, arrangements may be shown in block diagram form in order to avoid obscuring embodiments of the invention, and also in view of the fact that specifics with respect to implementation of such block diagram arrangements are highly dependent upon the platform within which the embodiment is to be implemented, i.e., such specifics should be well within purview of one skilled in the art. Where specific details (e.g., circuits) are set forth in order to describe example embodiments of the invention, it should be apparent to one skilled in the art that embodiments of the invention can be practiced without, or with variation of, these specific details. The description is thus to be regarded as illustrative instead of limiting.

The term "coupled" may be used herein to refer to any type of relationship, direct or indirect, between the components in question, and may apply to electrical, mechanical, fluid, optical, electromagnetic, electromechanical or other connections.

In addition, the terms "first", "second", etc. might be used herein only to facilitate discussion, and carry no particular temporal or chronological significance unless otherwise indicated.

Those skilled in the art will appreciate from the foregoing description that the broad techniques of the embodiments of the present invention can be implemented in a variety of forms. Therefore, while the embodiments of this invention have been described in connection with particular examples thereof, the true scope of the embodiments of the invention should not be so limited since other modifications will become apparent to the skilled practitioner upon a study of the drawings, specification, and following claims.

I claim:

1. A method comprising:
  receiving a first audio signal;
  receiving a reference clock associated with a signal other than the first audio signal;
  determining a specified number of frames;
  determining a specified number of clocks per number of frames;
  generating an audio pulse for each specified number of frames in the first audio signal;
  counting clock pulses in the reference clock for each audio pulse;
  generating one or more count signals associated with the counted clock pulses;
  averaging the one or more count signals;
  generating a signal that identifies an input number of clocks per number of frames based on the average;
  obtaining an audio sample signal from an audio sample buffer, wherein the audio sample signal is associated with the first audio signal;
  generating a ratio signal based on the input number of clocks per number of frames and the specified number of clocks per number of frames; and
  re-sampling the audio sample signal based on the ratio signal, the specified number of frames and the specified number of clocks per number of frames.

2. The method of claim 1, further including detecting a preamble in the first audio signal.

3. The method of claim 1, further including:
  obtaining a buffer status signal from the audio sample buffer;
  decreasing the ratio signal if the buffer status signal indicates that a buffer occupancy associated with the audio sample buffer is below a first threshold; and
  increasing the ratio signal if the buffer status signal indicates that the buffer occupancy is above a second threshold.

4. The method of claim 3, wherein the reference clock is associated with one or more of a second audio signal, a video signal, and a global positioning system (GPS) signal.

5. An apparatus comprising:
  a reference module to determine an input number of clocks per number of frames for an audio signal based on a reference clock and a specified number of frames; and
  a conversion module to re-sample the audio signal based on the input number of clocks per number of frames, the specified number of frames and a specified number of clocks per number of frames.

6. The apparatus of claim 5, wherein the reference module includes:
  a latch configuration to receive data associated with the audio signal and generate an audio pulse for each specified number of frames in the audio signal;

a clock counter stage to count clock pulses in the reference clock for each audio pulse generated by the latch configuration and generate one or more count signals; and a low pass filter to average the one or more count signals and generate a signal that identifies the input number of clocks per number of frames based on the average.

7. The apparatus of claim 6, wherein the latch configuration further includes an audio decoder to detect a preamble in the audio signal.

8. The apparatus of claim 5, wherein the conversion module includes:

an audio sample buffer to output an audio sample signal associated with the audio signal;

a sample ratio calculator to generate a ratio signal based on the input number of clocks per number of frames and the specified number of clocks per number of frames; and a sample rate converter to re-sample the audio sample signal based on the ratio signal, the specified number of frames and the specified number of clocks per number of frames.

9. The apparatus of claim 8, wherein the conversion module further includes an audio decoder coupled to the audio sample buffer.

10. The apparatus of claim 8, wherein the audio sample buffer is to generate a buffer status signal, and wherein the sample ratio calculator is to generate the ratio signal further based on the buffer status signal.

11. The apparatus of claim 10, wherein the sample ratio calculator is to decrease the ratio signal if the buffer status signal indicates that a buffer occupancy associated with the audio sample buffer is below a first threshold.

12. The apparatus of claim 10, wherein the sample ratio calculator is to increase the ratio signal if the buffer status signal indicates that a buffer occupancy associated with the audio sample buffer is above a second threshold.

13. A system comprising:

a video receiver to receive a video signal that includes a reference clock; and an audio receiver to receive an audio signal, wherein the audio receiver includes, a reference module to determine an input, number of clocks per number of frames for the audio signal based on the reference clock and a specified number of frames, and a conversion module to re-sample the audio signal based on the input number of clocks per number of frames, the specified number of frames and a specified number of clocks per number of frames.

14. The system of claim 13, wherein the reference module includes:

a latch configuration to receive data associated with the audio signal and generate an audio pulse for each specified number of frames in the audio signal, a clock counter stage to count clock pulses in the reference clock for each audio pulse generated by the latch configuration and generate one or more count signals, and a low pass filter to average the one or more count signals and generate a signal that identifies the input number of clocks per number of frames based on the average.

15. The system of claim 14, wherein the latch configuration further includes an audio decoder to detect a preamble in the audio signal.

16. The system of claim 13, wherein the conversion module includes:

an audio sample buffer to output an audio sample signal associated with the audio signal, a sample ratio calculator to generate a ratio signal based on the input number of clocks per number of frames and the specified number of clocks per number of frames, and a sample rate converter to re-sample the audio sample signal based on the ratio signal, the specified number of frames and the specified number of clocks per number of frames.

17. The system of claim 16, wherein the conversion module further includes an audio decoder coupled to the audio sample buffer.

18. The system of claim 16, wherein the audio sample buffer is to generate a buffer status signal, and wherein the sample ratio calculator is to generate the ratio signal further based on the buffer status signal.

19. The system of claim 18, wherein the sample ratio calculator is to decrease the ratio signal if the buffer status signal indicates that a buffer occupancy associated with the audio sample buffer is below a first threshold.

20. The system of claim 18, wherein the sample ratio calculator is to increase the ratio signal if the buffer status signal indicates that a buffer occupancy associated with the audio sample buffer is above a second threshold.

* * * * *

UNITED STATES PATENT AND TRADEMARK OFFICE
CERTIFICATE OF CORRECTION

PATENT NO.        : 8,773,291 B2  
APPLICATION NO.   : 13/997073  
DATED             : July 8, 2014  
INVENTOR(S)       : Ruan Page 1 of 1

It is certified that error appears in the above-identified patent and that said Letters Patent is hereby corrected as shown below:

In the Claims

Column 7, line 42, Claim 13, delete "input," and insert -- input --, therefor.

Signed and Sealed this  
Seventh Day of October, 2014

Michelle K. Lee  
*Deputy Director of the United States Patent and Trademark Office*